United States Patent
Naaman et al.

(10) Patent No.: US 9,928,948 B2
(45) Date of Patent: Mar. 27, 2018

(54) SUPERCONDUCTING SWITCH SYSTEM

(71) Applicants: Ofer Naaman, Ellicott City, MD (US); Mohamed O. Abutaleb, Laurel, MD (US)

(72) Inventors: Ofer Naaman, Ellicott City, MD (US); Mohamed O. Abutaleb, Laurel, MD (US)

(73) Assignee: Northrop Grumman Systems Corporation, Falls Church, VA (US)

(*) Notice: Subject to any disclaimer, the term of this patent is extended or adjusted under 35 U.S.C. 154(b) by 545 days.

(21) Appl. No.: 14/564,996

(22) Filed: Dec. 9, 2014

(65) Prior Publication Data
US 2017/0062107 A1 Mar. 2, 2017

(51) Int. Cl.
| | |
|---|---|
| H03H 3/00 | (2006.01) |
| H01F 6/06 | (2006.01) |
| H03K 17/92 | (2006.01) |
| H03H 7/01 | (2006.01) |

(52) U.S. Cl.
CPC ............ H01F 6/06 (2013.01); H03H 3/00 (2013.01); H03H 7/0153 (2013.01); H03K 17/92 (2013.01)

(58) Field of Classification Search
USPC ............ 333/167, 171, 174, 175, 176, 180
See application file for complete search history.

(56) References Cited

U.S. PATENT DOCUMENTS

| | | | | |
|---|---|---|---|---|
| 4,437,075 A | * | 3/1984 | Darmouni | H03H 7/075 333/138 |
| 4,785,426 A | * | 11/1988 | Harada | G11C 11/44 327/528 |
| 5,294,884 A | * | 3/1994 | Goto | G01R 33/0358 324/248 |
| 5,912,472 A | | 6/1999 | Voigtlaender et al. | |
| 7,385,465 B2 | * | 6/2008 | Chen | H03H 7/46 333/175 |
| 8,611,974 B2 | * | 12/2013 | Maibaum | B82Y 10/00 327/367 |
| 9,438,246 B1 | * | 9/2016 | Naaman | H03K 19/195 |

(Continued)

OTHER PUBLICATIONS

International Search Report for Application No. PCT/US2015/061315 dated Feb. 29, 2016.

(Continued)

Primary Examiner — Dean Takaoka
Assistant Examiner — Alan Wong
(74) Attorney, Agent, or Firm — Tarolli, Sundheim, Covell & Tummino LLP

(57) ABSTRACT

A superconducting switch system is provided that includes a filter network having an input portion and an output portion, and a variable inductance coupling element that couples the input portion to the output portion. The variable inductance coupling element has a first inductance that allows a desired portion of an input signal to pass from the input portion to the output portion as an output signal, and a second inductance state that suppresses the input signal from passing from the input portion to the output portion. The superconducting switch system further comprises a switch controller configured to control the switching of the variable inductance coupling element between the first inductance state and the second inductance state.

14 Claims, 7 Drawing Sheets

(56) References Cited

U.S. PATENT DOCUMENTS

| | | | |
|---|---|---|---|
| 9,768,771 B2* | 9/2017 | Naaman | H03K 17/92 |
| 2010/0164649 A1* | 7/2010 | Toncich | H01P 1/20 |
| | | | 333/174 |

OTHER PUBLICATIONS

Shimazu, et al, Characteristics of 1-20 switchable superconducting flux transformer with DC superconducting quantum interference 11, Japanese Journal of Applied Physics, Japan Society of Applied Physics, JP, vol. 46, No. 4A, Apr. 5, 2007 (Apr. 5, 2007), pp. 1478-1481, XP002743746.

Avenhaus, et al, "Switched lumped element bandstop filter", Electronics Letters, IEE Stevenage, GB, vol. 31, No. 12, Jun. 8, 1995 (Jun. 8, 1995), pp. 985-986, XP006002954.

Martens, et al: "HTS-based switched filter banks and delay lines", IEEE Transactions on Applied Superconductivity, IEEE Service Center, Los Alamitos, CA, US, vol. 3, No. 1, Mar. 1, 1993 (Mar. 1, 1993), pp. 2824-2827, XP011503312.

Huang, et al, "Lumped-element switchable superconducting filters", IEE Proceedings: Microwaves, Antennas and Propagation, IEE, Stevenage, Herts, GB, pp. 229-233, XP006013555.

Brummer, et al.: *"Phase and Amplitude Modulator for Microwave Pulse Generation"*; IEEE Transactions on Applied Superconductivity, vol. 21, No. 3, Jun. 2011, pp. 583-586.

Rafique, et al.: *"Niobium Tunable Microwave Filter"*; IEEE Transactions on Microwave Theory and Techniques, vol. 57, No. 5, May 2009, pp. 1173-1179.

\* cited by examiner

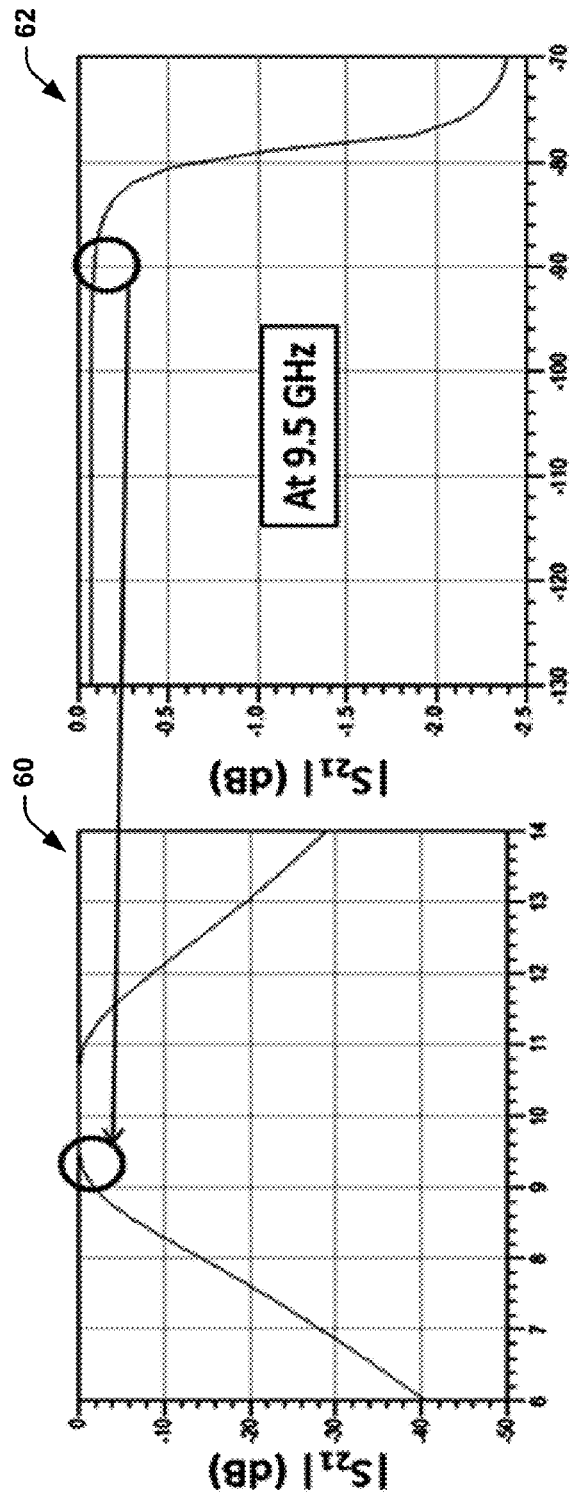
FIG. 6
FIG. 7
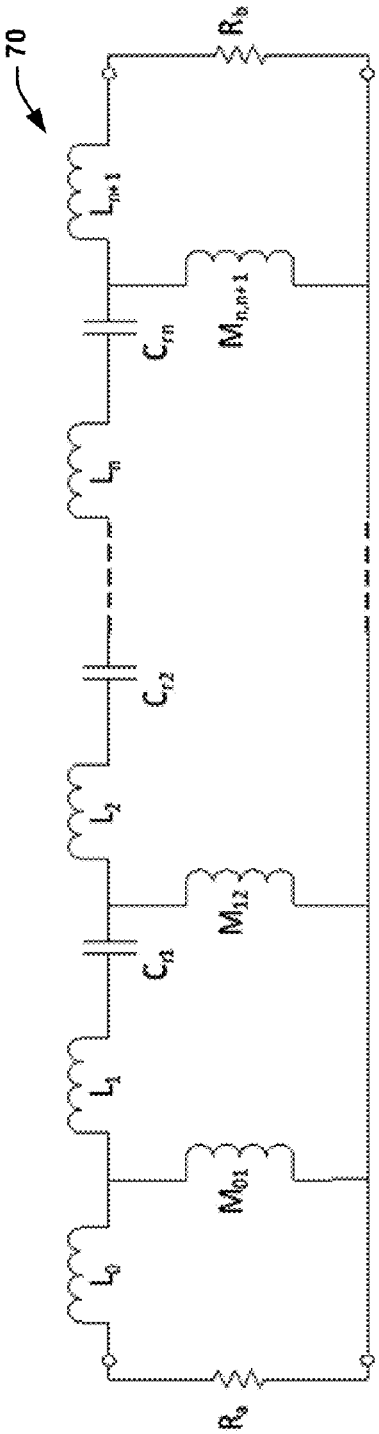
FIG. 8

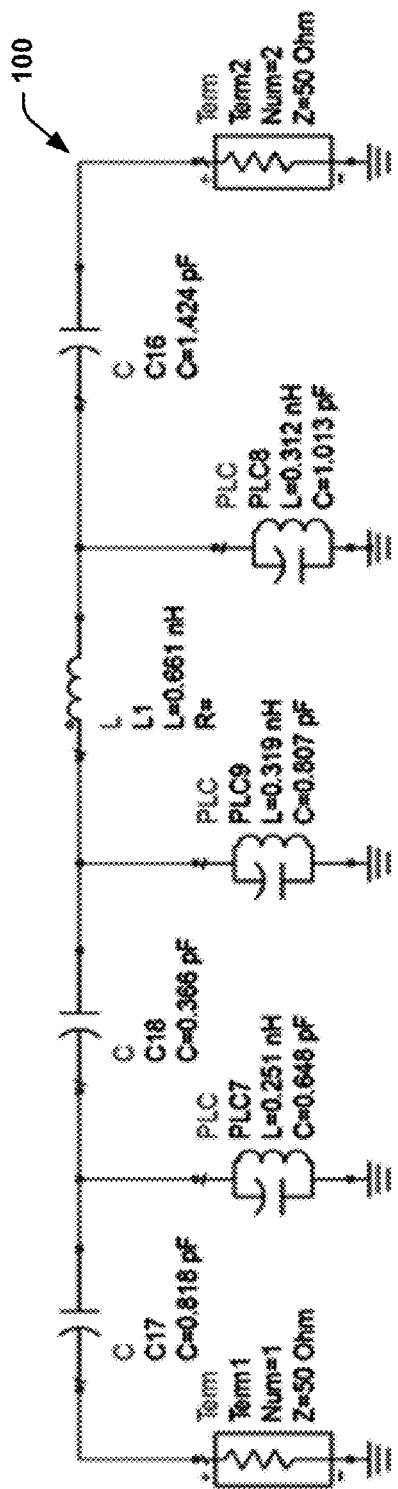
FIG. 12
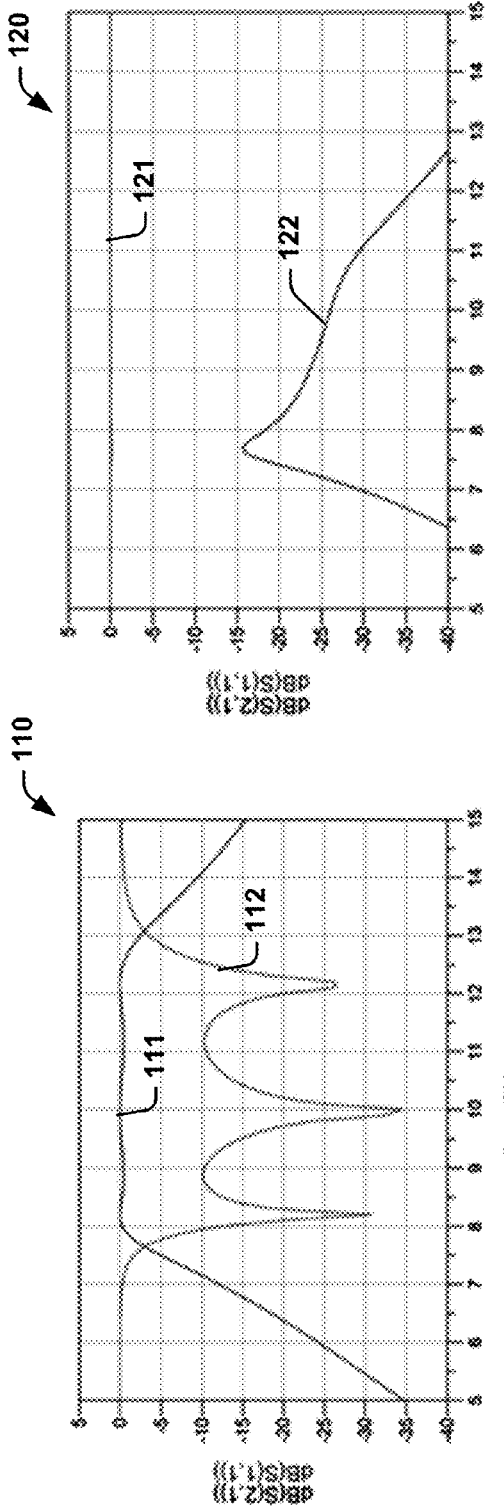
FIG. 13
FIG. 14

SUPERCONDUCTING SWITCH SYSTEM

TECHNICAL FIELD

The present invention relates generally to superconducting circuits, and more particularly to a superconducting switch system.

BACKGROUND

Conventional microwave mechanical, electro-mechanical, and electronic switches may not compatible with on-chip integration and cryogenic operation of superconducting electronic circuits, because of incompatible fabrication processes and high power dissipation. Likewise, tunable filters that are commonly realized by use of either active components such as voltage-variable capacitors i.e. varactors, mechanical drivers, or ferroelectric and ferrite materials, are not easily controllable by signal levels that can be generated with single flux quantum (SFQ) technologies, and many are not operable at cryogenic temperatures. While superconducting microwave filters, both fixed and tunable, have been previously realized using both high temperature and low temperature superconductors, their use in switching applications suffered from high return loss, limited usable bandwidth, and poor out-of-band off-state isolation

SUMMARY

In one example, a superconducting switch system is provided that comprises a filter network having an input portion and an output portion, and a variable inductance coupling element that couples the input portion to the output portion. The variable inductance coupling element has a first inductance state that allows a desired portion of an input signal to pass from the input portion to the output portion as an output signal, and a second inductance state that suppresses the input signal from passing from the input portion to the output portion. The superconducting switch system further comprises a switch controller configured to control the switching of the variable inductance coupling element between the first inductance state and the second inductance state.

In another example, a superconducting switch system comprises a filter network having an input terminal and an output terminal, and a Superconducting Quantum Interference Device (SQUID) coupled between the input terminal and the output terminal. The SQUID includes a Josephson junction, a first inductor coupled to a first end of the Josephson junction, and a second inductor coupled to a second end of the Josephson junction with opposing ends of the first and second inductors being connected to a common potential to form a superconducting loop. The superconducting switch system also includes a switch controller configured to control an amount of induced current through the superconducting loop to switch the Josephson junction between a first inductance state in which a desired bandwidth portion of an input signal provided at the input terminal is provided at the output terminal, and a second inductance state in which the desired bandwidth portion of the input signal provided at the input terminal is suppressed from passing to the output terminal.

In yet a further example, a method is provided of providing a superconducting switch system. The method comprises determining a desired pass-band output for passing a desired bandwidth portion of an input signal to an output of a superconducting switch, determining a band-pass filter network topology for the superconducting switch, and determining a radio frequency (RF) SQUID insertion point in the band-pass filter. The SQUID comprises a first inductor coupled to a variable inductance coupling element on a first end and a second inductor coupled to the variable inductance coupling element on a second end in a superconducting loop. The method further comprises determining one or more input resonator and one or more output resonator component values for providing the superconducting switch, and building a superconductor switch system that includes the superconducting switch. The superconductor switch comprises the one or more input resonators, the one or more output resonators and the SQUID. The superconductor switch system further comprises a bias inductor coupled to the SQUID and a switch controller that switches an amount of current through the bias inductor and induced in the SQUID to change the superconductor switch system between an 'ON' state and an 'OFF' state.

BRIEF DESCRIPTION OF THE DRAWINGS

FIG. 6 illustrates a graph of signal transmission through the switch versus frequency at a drive power of −90 dBm.

FIG. 7 illustrates a graph of power of signal transmission through the switch in the 'ON' state at a single frequency as a function of input power.

FIG. 8 illustrates a schematic diagram of a generic coupled resonator filter using inductive K-inverters.

FIG. 12 illustrates a schematic of a $3^{rd}$ order Chebyshev prototype that can be employed in a wide-bandwidth switch.

FIG. 13 illustrates a graph of transmission and reflection S-parameters versus frequency of the simulated response of a filter of FIG. 12 configured as a wide-bandwidth switch in the 'ON' state.

FIG. 14 illustrates a graph of transmission and reflection S-parameters versus frequency of the simulated response of the filter of FIG. 12 configured as a wide-bandwidth switch in the 'OFF' state.

DETAILED DESCRIPTION

The present disclosure relates generally to superconducting circuits, and more particularly to a superconducting switch system. A superconducting switch system can include a variable inductance coupler (also referred to as variable inductance coupling element) that couples and decouples sections of a filter network. In one example, the variable inductance coupler is an element of a Superconducting Quantum Interference Device (SQUID). The SQUID can include a first inductor and a second inductor coupled to opposite sides of a variable inductance coupler all arranged in a superconducting loop. The variable inductance coupler can be, for example, a Josephson junction that has an inductance that can be varied based on a current flowing through the Josephson junction. The current flowing through the Josephson junction can be induced based on a flux applied to the SQUID by, for example, a bias element.

In one example, the Josephson junction can have a first inductance when no current or a low current is induced in the SQUID, and a second inductance when a current or a higher current is induced in the SQUID that is at a predetermined threshold. The predetermined threshold current induced in the SQUID can be a result of applying a flux to the SQUID from a bias element, for example, greater than about 0.1 $\Phi_0$ and less than about 0.45 $\Phi_0$, where $\Phi_0$ is equal to a flux quantum. The first inductance can be the passive inductance of a Josephson junction (e.g., $h/2e*1/I_C$, where h is the reduced Planck's constant, e is the elementary charge and $I_C$ is the critical current of the Josephson junction) when no induced current flows through the Josephson junction. This allows for coupling between a first section of a filter network and a second section of the filter network, such that the superconducting switch system is in an 'ON' state allowing passing of a desired bandwidth portion of an input signal. The second inductance (e.g., large inductance value) can provide decoupling between the first and second section of the filter network such that the superconducting switch system is in an 'OFF' state suppressing the input signal.

Figure 1:
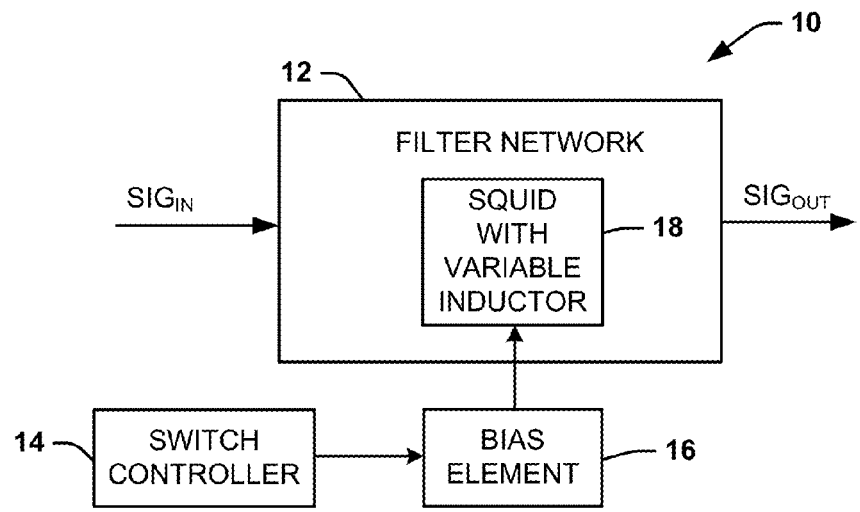
FIG. 1 illustrates an example of a superconducting switch system.

FIG. 1 illustrates an example of a superconducting switch system 10. The superconducting switch system 10 can be implemented in any of a variety of superconducting circuit systems to provide switch control of an input signal $SIG_{IN}$. As an example, the input signal $SIG_{IN}$ can be a microwave signal that is implemented in a control scheme for a quantum circuit, such as performing a gate or a readout operation on a qubit. As another example, the input signal $SIG_{IN}$ can be a signal pulse or another type of signal. The superconducting switch system 10 can provide a band-pass filtered output signal $SIG_{OUT}$ that can corresponds to a desirable portion (e.g., particular frequency bandwidth) of the input signal $SIG_{IN}$ when the superconducting system is an 'ON' state (i.e., pass state). Additionally, all of the spectrum of the input signal $SIG_{IN}$ can be suppressed or blocked such that none of the desired portion of the input signal $SIG_{IN}$ is provided as the output signal when in an 'OFF' state (i.e., suppressed state). The superconducting switch system 10 includes a filter network 12 having one or more impedance components (i.e., capacitors, resistors, inductors) for configuring an input portion of the filter network 12 as one or more input resonators, and an output portion of the filter network 12 as one or more output resonators. At least one of the one or more input resonators and output resonators can be implemented as short-terminated transmission line stubs.

The filter network 12 also includes a SQUID 18 with a variable inductance coupler (e.g., Josephson junction). The SQUID 18 also includes one or more components that operate both as components of a superconducting loop of the SQUID 18, and impedance components of the one or more input and/or the one or more output resonators. A bias element 16 is inductively coupled to the SQUID 18 to induce current in the SQUID 18. A change in the current induced in the SQUID 18 can result in a change in inductance of the variable inductance coupler.

For example, the inductance of the variable inductance coupling element can be changed to a first inductance state, for example, when substantially no induced current or a low induced current is induced in the superconducting loop of the SQUID 18, such that the inductance of the variable inductance coupling element is low. When the variable inductance coupling element is in the first inductance state, the first portion of the network is coupled to the second portion of the filter network and the superconducting switch system 10 is in the 'ON' state. Alternatively, the inductance of the variable inductance coupling element can be changed to a second inductance state, for example, when a substantial current (e.g., caused by induction of a substantial fraction of half of a flux quantum in the SQUID) is induced in the superconducting loop of the SQUID 18, such that the inductance of the variable inductance coupling element is high. When the variable inductance coupling element is in a high inductance state, the first portion of the network is decoupled from the second portion of the filter network and the superconducting switch system 10 is in the 'OFF' state. The bias element 16 can be controlled by a switch controller 14 that controls an amount of bias current to the bias element 16, which in turn, controls an amount of flux applied to the SQUID and an amount of current induced in the SQUID 18 and flowing through the variable inductance coupler.

Figure 2:
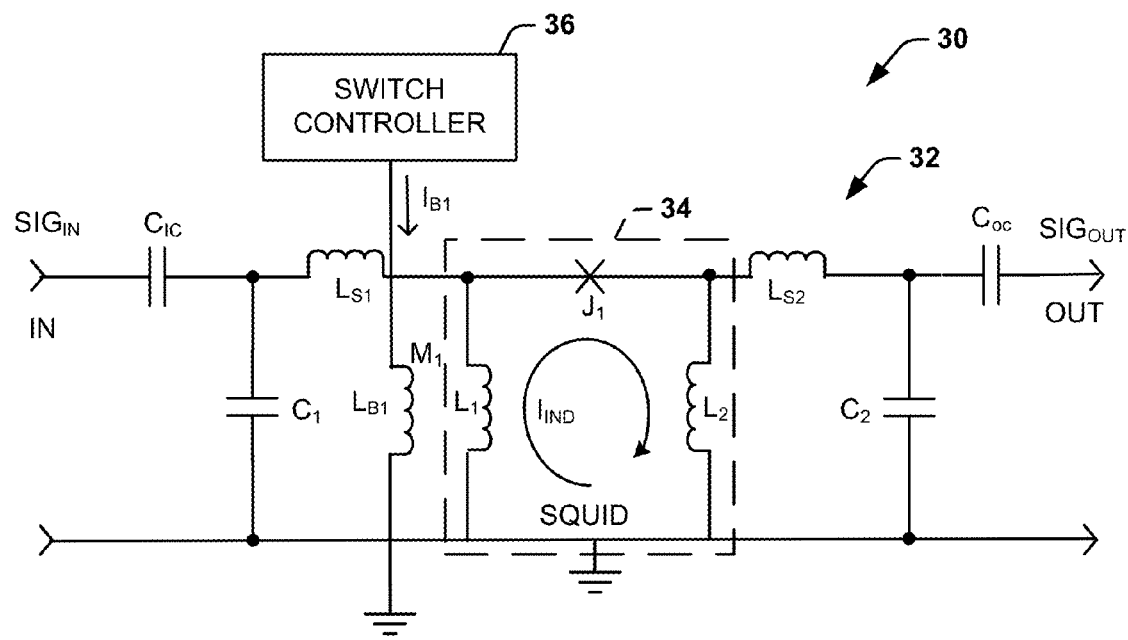
FIG. 2 illustrates another example of a superconducting switch system.

FIG. 2 illustrates an example of a superconducting switch system 30 having a filter network 32 configured as a single-pole-single-throw (SPST) microwave switch. In the example of FIG. 2, a two-section coupled-resonator band-pass filter is embedded with a radio frequency SQUID 34 having a tunable inductance coupler in the form of a Josephson junction $J_1$. The SQUID 34 can include a first inductor $L_1$ and a second inductor $L_2$ coupled to opposite sides of the Josephson junction $J_1$ with opposing ends of the first and second inductor coupled to a common potential to form a superconducting loop. The first inductor $L_1$ can be employed to form an input pole along with other components of an input resonator of the band-pass filter, and the second inductor $L_2$ can be employed to form an output pole along with other components of an output resonator of the band-pass filter. In the present example, the input resonator is formed of a first capacitor $C_1$, an inductor $L_{S1}$ and the first inductor $L_1$.

An input signal ($SIG_{IN}$) is provided at an input terminal (IN) to the input resonator through an input coupling capacitor $C_{IC}$. The output resonator is formed of a second capacitor $C_1$, an inductor $L_{S2}$ and the second inductor $L_2$. An output signal ($SIG_{OUT}$) can be provided at an output terminal (OUT) from the output resonator through an output coupling capacitor $C_{OC}$. The input coupling capacitor $C_{IC}$ and the output coupling capacitor $C_{OC}$ assure that the current flowing through the superconducting loop of the SQUID 34 is isolated such that it remains in the SQUID 34 and does not flow to other parts of the circuit.

The Josephson junction $J_1$ has an inductance that can be varied based on the induced current flowing through the Josephson junction $J_1$. A bias inductor $L_B$ is inductively coupled to the SQUID 34 to apply flux to the SQUID 34 and to induce current in the SQUID 34. The bias inductor $L_B$ can be controlled by a switch controller 36 that controls an amount of bias current $I_B$ to the bias inductor LB, which in turn, controls an amount of induced current $I_{IND}$ in the SQUID 34 and flowing through the Josephson junction J1. The Josephson junction $J_1$ can have a first inductive state when no current or a low current is induced in the SQUID, such that the input resonator is coupled to the output resonator of the filter network 32 through the Josephson junction J1. The Josephson junction J1 can have a second inductive state such when a predetermined higher current is flowing through the Josephson junction J1. The second inductive state is a high inductance that essentially decouples the input resonator from the output resonator and suppresses the input signal from being provided as an output signal.

In the example of FIG. 2, when a first flux is applied to the RF SQUID loop 34 defined by Josephson junction J1 and inductors $L_1$ and $L_2$, a first induced current flows through the junction J1 resulting in junction J1 having a first inductance value. This first inductance state can be designed such that the circuit as a whole functions as a band-pass filter with low insertion loss in its pass-band. The superconducting switch system 10 is then said to be in an 'ON' state. When a second flux is applied to the RF SQUID loop, a second higher current is induced in the junction J1 causing its inductance value to increase, driving the inductive coupling between the input and output stages to zero. The two sections of the band-pass filter formed from the input resonator and the output resonator are then decoupled from each other, such that the filter circuit as a whole has a high return loss at all frequencies because the filter becomes reflective. The superconducting switch system 30 is then said to be in an 'OFF' state. In one example, the first applied flux is at or close to zero, and the second applied flux is an appreciable fraction of half a flux quantum (e.g., about 0.1 $\Phi_0$ to about 0.45 $\Phi_0$).

Figure 3:
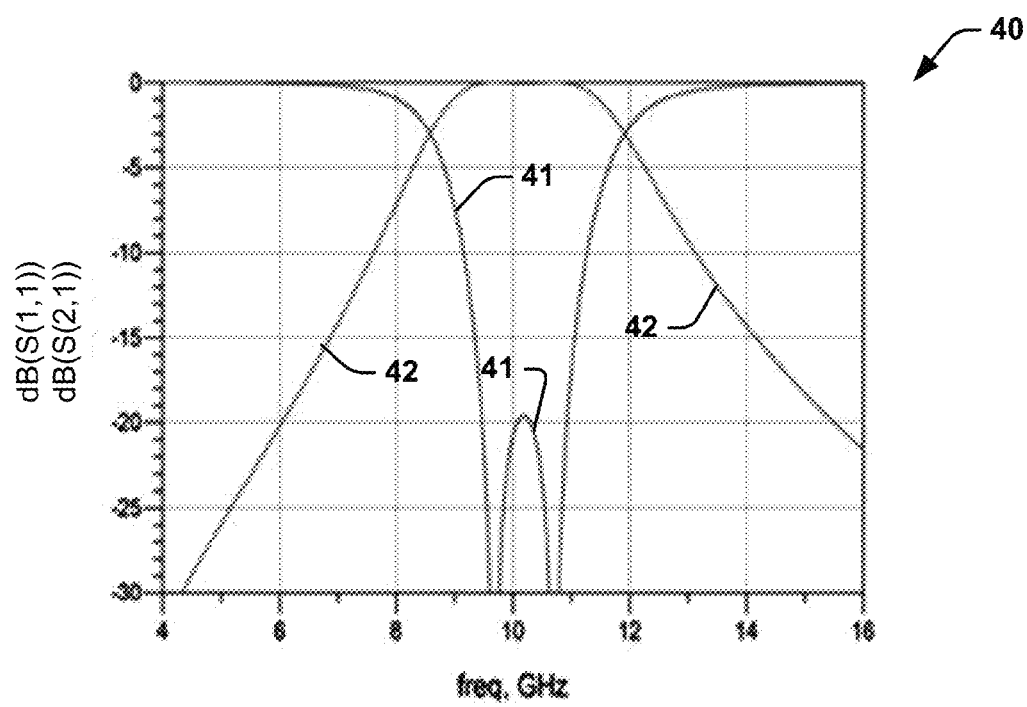
FIG. 3 illustrates a graph of transmission and reflection scattering S-parameters versus frequency of the simulated response of the filter of FIG. 2 in the 'ON' state.
Figure 4:
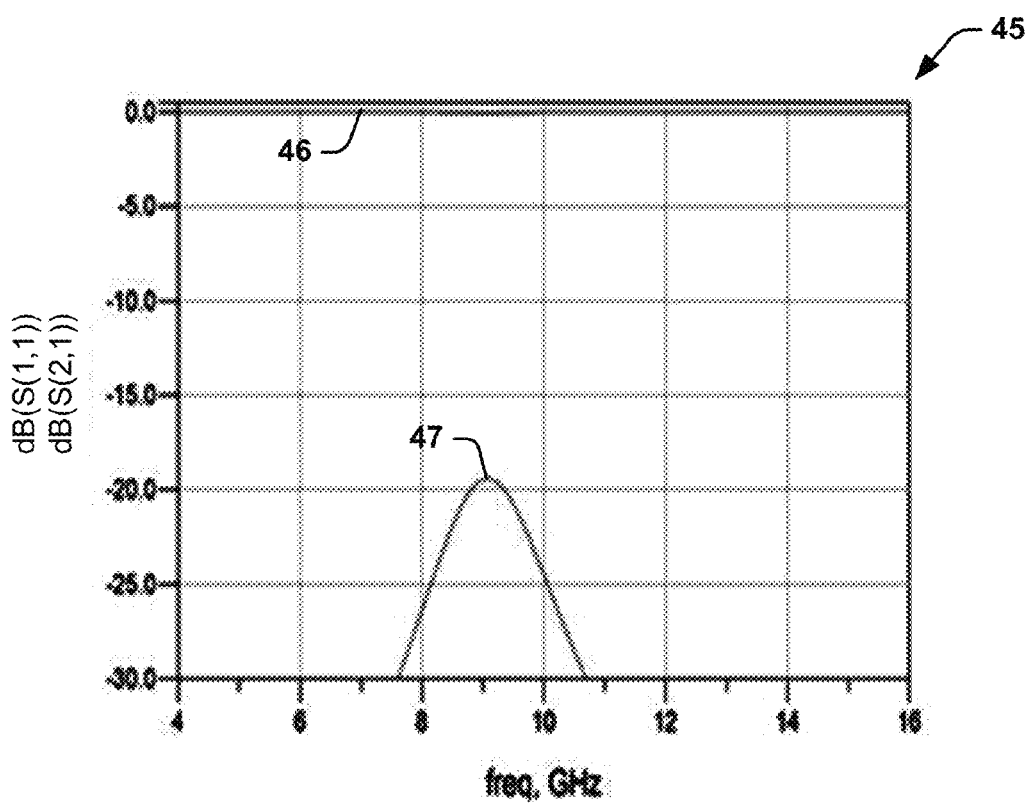
FIG. 4 illustrates a graph of transmission and reflection scattering S-parameters versus frequency of the simulated response of the filter of FIG. 2 in the 'OFF' state.

FIGS. 3-4 illustrate graphical responses of simulations of the filter switch 32 of FIG. 2 using Agilent Advanced Design System (ADS). In this simulation, the Josephson junction J1 is treated as a linear inductor corresponding to its Josephson inductance at low drive power. The simulated component values are $L_{S1}=L_{S2}=60$ pH, $L_1=L_2=169$ pH, $C_1=C_2=1.19$ pF, $C_{IC}=C_{OC}=0.659$ pF, and the inductance corresponding to the junction $L_{J1}=375$ pH. FIG. 3 illustrates a graph 40 of gain versus frequency showing $S_{21}$ and $S_{11}$ of the filter switch 32 in the 'ON' state, showing a 2 GHz pass-band centered about 10 GHz. The $S_{21}$ parameter is shown in the signal transmission plot 42 and the $S_{11}$ parameter is shown in the signal reflection plot 41. The filter switch 32 is then turned to the 'OFF' state by applying a predetermined flux to the RF SQUID loop, causing the inductance of junction $J_1$ to increase. The increasing effective inductance of the RF SQUID is modeled in a graph 45 illustrated in FIG. 4, which illustrates gain versus frequency, by raising the value of the junction inductance by a factor of 30. The $S_{21}$ parameter is shown in the signal transmission plot 46 and the $S_{11}$ parameter is shown in the signal reflection plot 47. An overall suppression of the $S_{21}$ parameter, and in particular a 20 dB reduction of the transmission in the pass-band is realized.

Figure 5:
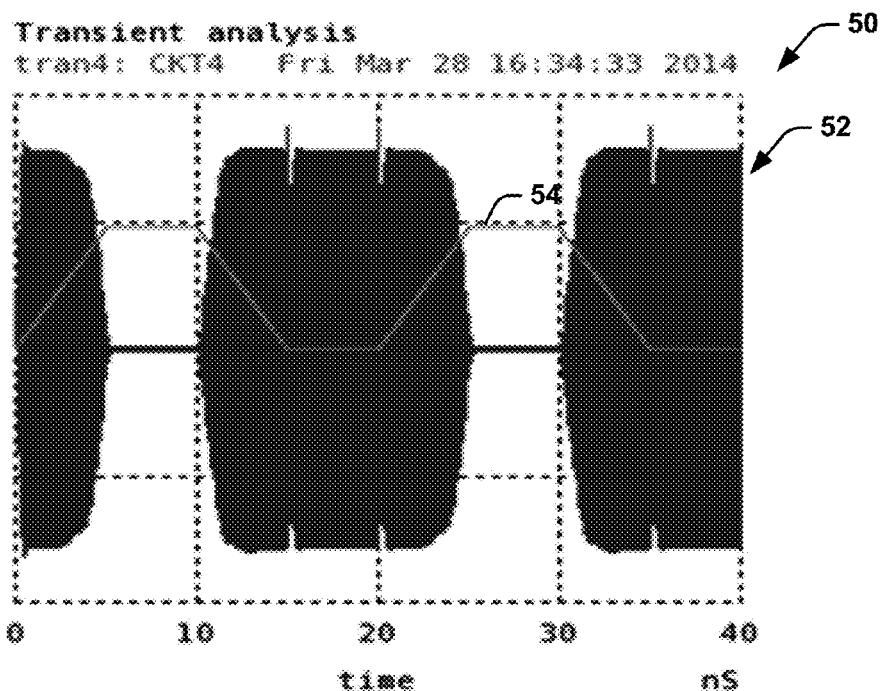
FIG. 5 illustrates a WRSpice simulation that outputs a graph of an output response versus time for the filter switch of FIG. 2.

FIG. 5 illustrates a WRSpice simulation that outputs a graph 50 of an output response versus time for the filter switch 32 of FIG. 2. All component values are the same as indicated above. Flux bias is applied to the RF SQUID by the current $I_b$ and the bias component $L_B$ via the switch controller 36. The input waveform is a 10 GHz sinusoid at a power of −120 dBm, the flux bias waveform 54 is piecewise linear in shape, and the voltage at the load termination (filter output) is shown as output waveform 52. As shown, in response to a flux bias sweep from 0 to 0.37 $\Phi_0$, the output voltage changes by a factor of over 80, corresponding to over 30 dB switch ON/OFF ratio.

A harmonic-balance simulation was also performed in ADS on the circuit of FIG. 2, treating the Josephson junction as a nonlinear inductor. This simulation captures the power dependence of the switch performance expected in circuits containing Josephson junctions. FIG. 6 illustrates a graph 60 of signal transmission through the switch versus frequency at a drive power of −90 dBm. FIG. 7 illustrates a graph 62 of power of signal transmission through the switch in the 'ON' state at a single frequency as a function of input power as well as the large-amplitude $S_{21}$. The simulation as illustrated in FIG. 6 indicates that the switch can handle input powers up to −90 dBm without degradation to its 'ON' state response. The off state isolation begins to degrade at approximately −80 to −85 dBm according to transient analysis of the circuit model. The applied flux at the 'OFF' state can be adjusted to improve switch performance at these power levels.

The utilization of an RF SQUID embedded in a filter network to provide a superconducting switch system has been illustrated for one particular example. However, the utilization of an RF SQUID embedded in a filter network to provide a superconducting switch system can be employed in a variety of different filter topologies. For example, a lumped-element, coupled-resonator topology, can be employed where resonators having a frequency that coincides with the center frequency of the filter are coupled via admittance (J) or impedance (K) inverters, and the coupling coefficients of the inverters are related to tabulated filter prototypes to realize a desired response (e.g. Chebyshev, max-flat, etc.). At least one of the inverters can be implemented as an inductive network having a "pi" circuit topology. The series inductor of the pi-section inverter can be replaced with a Josephson junction so that the inverter becomes an RF SQUID.

For example, FIG. 8 illustrates a schematic diagram of a generic coupled resonator filter 70 using inductive K-inverters. The circuit components can be computed according to tabulated filter prototypes to give a desired response. The circuit 70 of FIG. 8 can be modified by commuting the series inductors and capacitors, forming T-networks of inductors between each capacitor. The T-networks can then be transformed to pi-networks to integrate the RF SQUID design, replacing at least one of the resulting series inductors with a Josephson junction.

Figure 9:
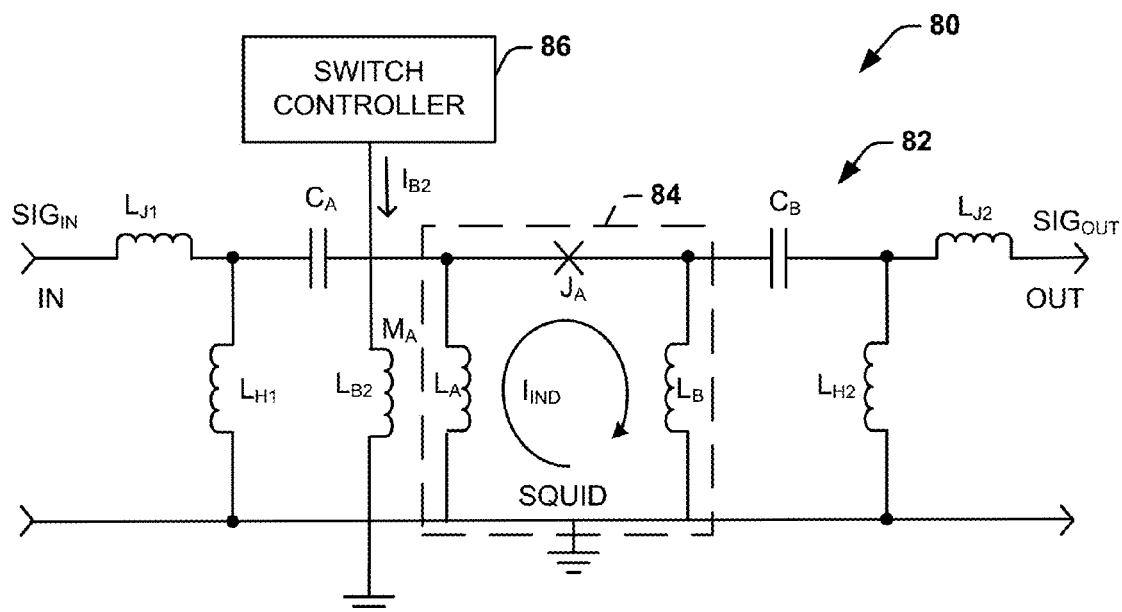
FIG. 9 illustrates a block schematic diagram of another example of a superconducting switch system.

As an example, a circuit schematic of another example of a superconducting switch system 80 is shown in FIG. 9 for the filter type of FIG. 8 with an order of 2, where an RF SQUID loop 84 is formed by junction $J_A$ and inductors $L_A$ and $L_B$. The inductor $L_A$ can be employed to form an input pole of an input resonator along with inductor $L_{H1}$ and capacitor $C_A$. The inductor $L_B$ can be employed to form an output pole of an output resonator along with inductor $L_{H2}$ and capacitor $C_B$. An input signal ($SIG_{IN}$) is provided at an input terminal (IN) to the input resonator through an input coupling inductor $L_{J1}$. An output signal ($SIG_{OUT}$) can be provided at an output terminal (OUT) from the output resonator through an output coupling inductor $L_{J2}$. The capacitor $C_A$ and the capacitor $C_B$ also act as coupling capacitors to isolate the induced current that runs through the superconducting loop of the RF SQUID 84 from other parts of the circuit.

Figure 10:
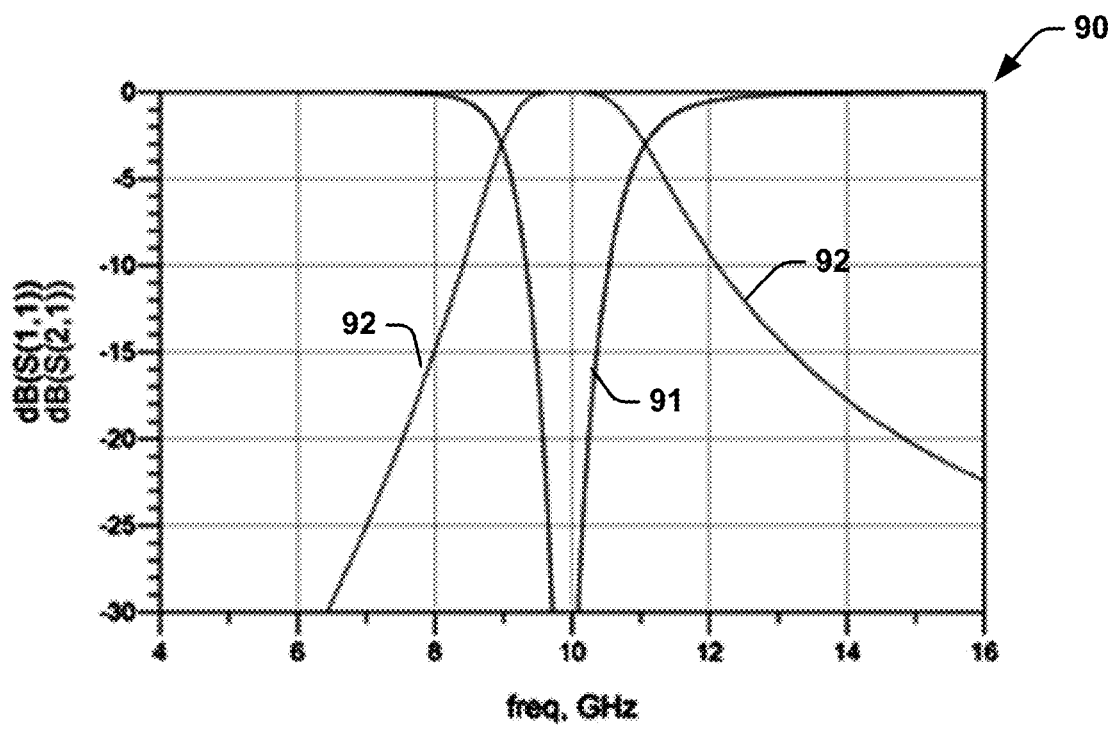
FIG. 10 illustrates a graph of transmission and reflection scattering S-parameters versus frequency of the simulated response of the filter of FIG. 9 in the 'ON' state.
Figure 11:
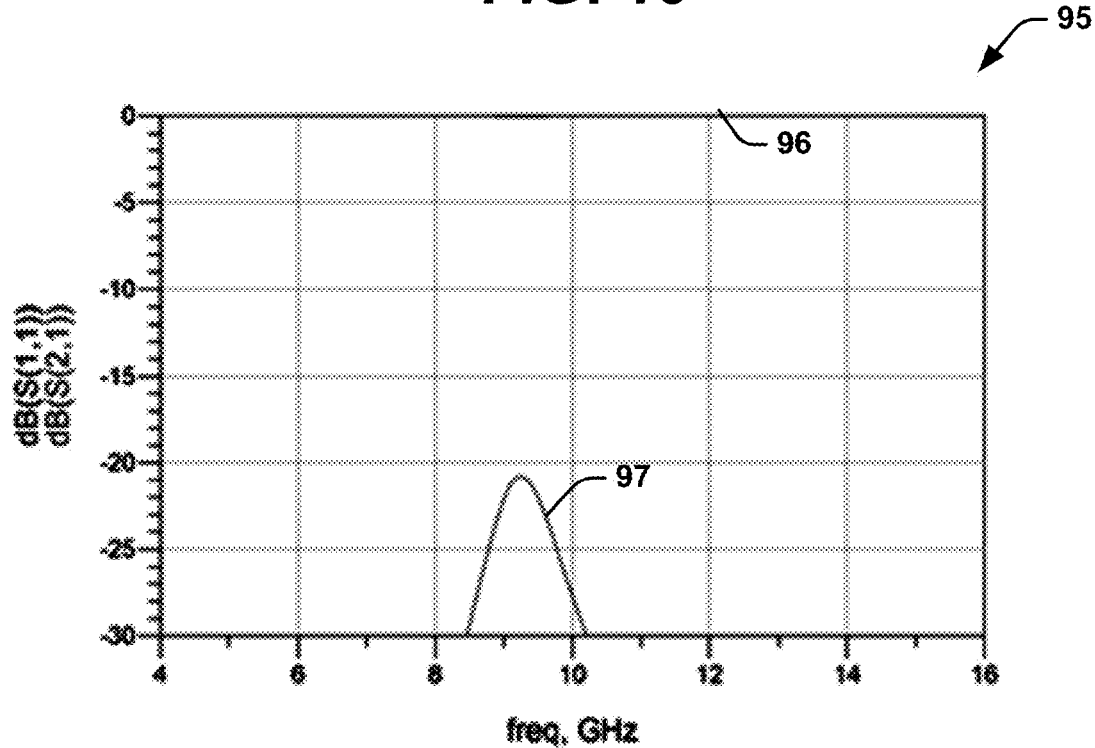
FIG. 11 illustrates a graph of transmission and reflection scattering S-parameters versus frequency of the simulated response of the filter of FIG. 9 in the 'OFF' state.

A bias inductor $L_{B2}$ is inductively coupled to the SQUID 84 to induce current in the SQUID 84. The bias inductor $L_{B2}$ can be controlled by a switch controller 86 that controls an amount of bias current $I_{B2}$ to the bias inductor $L_{B2}$, which in turn, controls an amount of induced current $I_{IND}$ in the SQUID 84 and flowing through the Josephson junction $J_A$. The Josephson junction $J_A$ has an inductance that can be varied based on the induced current flowing through the Josephson junction $J_A$. The Josephson junction $J_A$ can have a first inductance state when no current or a low current is flowing through the SQUID 84, such that the desired portion of the input signal passes through the filter network 82 through the Josephson junction $J_A$ to be provided as an output signal. The Josephson junction $J_A$ can have a second inductance state that essentially decouples the input portion of the filter network 82 from the output portion of the filter network 82 suppressing the input signal from being provided as an output signal. In this particular example, the circuit parameters are $L_{H1}=L_{H2}=104$ pH, $L_{J1}=L_{J2}=46.0$ pH, $L_A=L_B=132$ pH, $C_A=C_B=1.74$ pF, and the junction effective inductance $L_{J\_A}=566$ pH corresponding to a critical current $I_0=0.58$ µA. FIG. 10 illustrates a graph 90 of gain versus frequency of the simulated response of this filter in the 'ON' state. The $S_{21}$ parameter is shown in the signal transmission plot 92 and the $S_{11}$ parameter is shown in the signal reflection plot 91. FIG. 11 illustrates a graph 95 of gain versus frequency of the simulated response of this filter in the 'OFF' state. The $S_{21}$ parameter is shown in the signal transmission plot 96 and the $S_{11}$ parameter is shown in the signal reflection plot 97.

As another example, a 40% bandwidth switch 100 can be provided based on a $3^{rd}$ order Chebyshev prototype, having the topology shown in FIG. 12. Inductor L1 in FIG. 12 can be replaced with a Josephson junction, and an RF SQUID is then formed by the combination of L1 and the shunt inductances of resonators PLC8 and PLC 9. FIG. 13 shows a graph 110 of the results of an S-parameter simulation of this design in an 'ON' state with the Josephson junction being approximated by a linear inductor. The $S_{21}$ parameter is shown in the signal transmission plot 111 and the $S_{11}$ parameter is shown in the signal reflection plot 112. FIG. 14 shows a graph 120 of the results of an S-parameter simulation of this design in an 'OFF' state with the Josephson junction being approximated by a linear inductor. The $S_{21}$ parameter is shown in the signal transmission plot 121 and the $S_{11}$ parameter is shown in the signal reflection plot 122.

In summary, an RF SQUID tunable inductance coupler can be embedded in a coupled-resonator band-pass filter to implement a microwave switch, with better than 20 dB on/off ratio, up to 40% bandwidth, and input powers up to −85 dBm. The switch is actuated by application of flux to the RF SQUID in a manner that is compatible with SFQ control.

Figure 15:
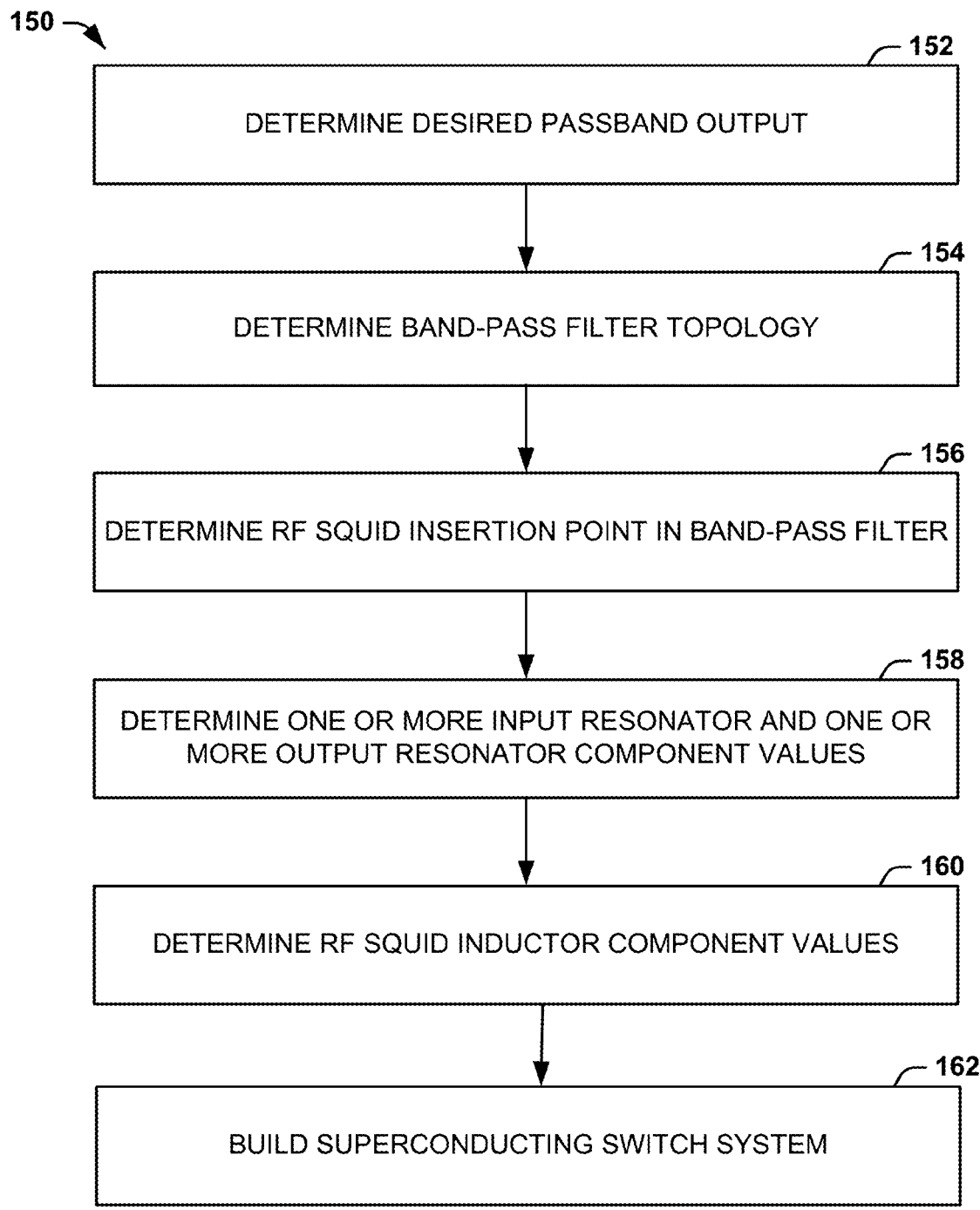
FIG. 15 illustrates a method for providing a superconducting switch system.

In view of the foregoing structural and functional features described above, a methodology in accordance with various aspects of the present invention will be better appreciated with reference to FIG. 15. While, for purposes of simplicity of explanation, the methodology of FIG. 15 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 15 illustrates a method 150 for providing a superconducting switch system. The methodology begins at 152, where a desired pass-band output is determined for passing an input signal through a switch as an output signal or suppressing the input signal from passing to the output of the switch. At 154, a desired band-pass filter topology is determined for providing a superconducting switch. As previously discussed, a variety of different filter topologies can be selected from to provide a superconducting switch system based on a desired pass-band output response. At 156, an RF SQUID insertion point is determined based on the selected filter topology. The methodology then proceeds to 158.

At 158, one or more input resonators and one or more output resonator component values are selected to provide the desired pass-band output based on the determined pass-band filter topology and RF SQUID insertion point. This includes assuring that the resonators include isolation capacitors to ensure that the current flowing through the SQUID does not flow into other parts of the circuit. The SQUID can include a first and second inductor coupled to opposite sides of a variable inductance coupling element (e.g., Josephson junction). At 160, the RF SQUID component values are determined based on the one or more output resonator component values and the desired pass-band output constrained by assuring the SQUID linear inductance does not exceed the inductance of the variable inductance element.

Assuring that the SQUID linear inductance does not exceed the inductance of the variable inductance element, ensures that the potential of the RF SQUID is monostable. At 162, the superconducting switch system is built including the microwave switch with the above selected components, a bias inductor and a switch controller to drive the bias inductor into inducing a current in the SQUID that can change a value in the variable inductance coupling element between a pass state for passing a desired pass-band of an input signal to a suppressed state for suppressing a the input signal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconducting switch system comprising:
   a filter network having an input portion and an output portion;
   one or more input resonators formed of a first inductor and one or more additional impedance components;
   one or more output resonators formed of a second inductor and one or more additional impedance components;
   a Josephson junction that couples the input portion to the output portion, the Josephson junction having a first inductance state that allows a desired portion of an input signal to pass from the input portion to the output portion as an output signal, and a second inductance state that suppresses the desired portion of the input signal from passing from the input portion to the output portion; and
   a switch controller configured to control the switching of the Josephson junction between the first inductance state and the second inductance state,
   wherein the Josephson junction is coupled on a first end to the first inductor and on a second end to the second inductor, and
   wherein the first inductor, the Josephson junction and the second inductor form a Superconducting Quantum Interference Device (SQUID).

2. The system of claim 1, wherein the Josephson junction is configured as a flux-controlled variable inductor that provides variable inductance based on an amplitude of a current flowing through the flux-controlled variable inductor.

3. The system of claim 1, further comprising a bias element inductively coupled to the SQUID to induce a current through the SQUID based on a current flowing through the bias element.

4. The system of claim 3, wherein the switch controller controls an amount of current through the bias element.

5. The system of claim 4, wherein the switch controller can provide either a current or no current to the bias element that substantially induces a low current or no current to the SQUID to provide the first inductance or provide a current to the bias element that substantially induces a second predetermined current due to a flux applied to the SQUID of about 0.1 $\Phi_0$ to about 0.45 $\Phi_0$, where $\Phi_0$ is equal to a flux quantum.

6. The system of claim 1, further comprising an input coupling capacitor coupled between an input of the filter network and the SQUID and an output coupling capacitor coupled between an output of the filter network and the SQUID, the input coupling capacitor and the output coupling capacitor ensuring that current that flows through the SQUID is isolated from flowing through other parts of the filter network.

7. A superconducting switch system comprising:
a filter network having an input terminal and an output terminal;
a Superconducting Quantum Interference Device (SQUID) coupled between the input terminal and the output terminal, the SQUID having a Josephson junction, a first inductor coupled to a first end of the Josephson junction, and a second inductor coupled to a second end of the Josephson junction with opposing ends of the first and second inductor coupled to a common potential to form a superconducting loop;
a switch controller configured to control an amount of induced current through the superconducting loop to switch the Josephson junction between a first inductance state in which a desired bandwidth portion of an input signal provided at the input terminal is provided at the output terminal, and a second inductance state in which the desired bandwidth portion of the input signal provided at the input terminal is suppressed from passing to the output terminal; and
a bias element inductively coupled to the SQUID to induce a current through the SQUID based on a current flowing through the bias element,
wherein the switch controller switches between either providing a current to the bias element that substantially induces no current or a low current to the SQUID to provide the first inductance or providing a current to the bias element that substantially induces a second predetermined current to the SQUID to provide the second inductance, the switching system being in the 'ON' state at the first inductance, and the 'OFF' state at the second inductance.

8. The system of claim 7, further comprising one or more input resonators formed of the first inductor and one or more additional impedance components and one or more output resonators formed of the second inductor and one or more additional impedance components.

9. The system of claim 8, wherein the at least one of the one or more input resonators and output resonators is implemented as short-terminated transmission line stubs.

10. The system of claim 8, wherein an input resonator is formed of the first inductor series coupled with a third inductor and coupled in parallel with a first capacitor, and an output resonator is formed of the second inductor series coupled with a fourth inductor and coupled in parallel with a second capacitor.

11. The system of claim 8, wherein an input resonator is formed of the first inductor series coupled with a first capacitor and coupled in parallel with a third inductor, and an output resonator is formed of the second inductor series coupled with a second capacitor and coupled in parallel with a fourth inductor.

12. The system of claim 11, further comprising an input coupling inductor between the input terminal and the third inductor, and an output coupling inductor between the output terminal and the fourth inductor.

13. The system of claim 7, further comprising an input coupling capacitor coupled between the input terminal and the SQUID and an output coupling capacitor coupled between the output terminal and the SQUID, the input coupling capacitor and the output coupling capacitor ensuring that current that flows through the SQUID is isolated from flowing though other parts of the filter network.

14. A method of providing a superconducting switch system, the method comprising:
determining a desired pass-band output for passing a desired bandwidth portion of an input signal to an output of a superconducting switch;
determining a band-pass filter network topology for the superconducting switch;
determining a radio frequency (RF) Superconducting Quantum Interference Device (SQUID) insertion point in the band-pass filter, the RF SQUID comprising a first inductor coupled to a variable inductance coupling element on a first end and a second inductor coupled to the variable inductance coupling element on a second end in a superconducting loop;
determining one or more input resonators and one or more output resonator component values for providing the superconducting switch;
building a superconductor switch system that includes the superconducting switch comprising the one or more input resonators, the one or more output resonators and the RF SQUID, a bias inductor coupled to the RF SQUID and a switch controller that switches an amount of current through the bias inductor and induced in the RF SQUID to change the superconductor switch system between one of an 'ON' state and an 'OFF' state; and
determining inductor component values for the RF SQUID, wherein the determining inductor component values of the RF SQUID comprises assuring that the RF SQUID linear inductance does not exceed the inductance of the variable inductance element.

* * * * *